US009601341B2

(12) United States Patent
Ashraf

(10) Patent No.: US 9,601,341 B2
(45) Date of Patent: Mar. 21, 2017

(54) METHOD OF ETCHING

(71) Applicant: SPTS TECHNOLOGIES LIMITED, Newport (GB)

(72) Inventor: Huma Ashraf, Newport (GB)

(73) Assignee: SPTS Technologies Limited, Newport (GB)

(*) Notice: Subject to any disclaimer, the term of this patent is extended or adjusted under 35 U.S.C. 154(b) by 0 days.

(21) Appl. No.: 14/577,442

(22) Filed: Dec. 19, 2014

(65) Prior Publication Data
US 2015/0179468 A1    Jun. 25, 2015

(30) Foreign Application Priority Data
Dec. 23, 2013 (GB) .................................. 1322931.5

(51) Int. Cl.
H01L 21/76      (2006.01)
H01L 21/3065    (2006.01)
H01L 21/033     (2006.01)
H01L 21/308     (2006.01)
H01L 21/02      (2006.01)
H01L 21/768     (2006.01)
H01L 23/48      (2006.01)

(52) U.S. Cl.
CPC .... H01L 21/30655 (2013.01); H01L 21/0212 (2013.01); H01L 21/0334 (2013.01); H01L 21/3081 (2013.01); H01L 21/3083 (2013.01); H01L 21/3086 (2013.01); H01L 21/76816 (2013.01); H01L 23/481 (2013.01); *H01L 2924/0002* (2013.01)

(58) Field of Classification Search
CPC ........... H01L 21/02019; H01L 21/3065; H01L 21/30655; H01L 21/30604; H01L 21/30621; H01L 21/308; H01L 21/3081; H01L 21/3083; H01L 21/3085; H01L 21/3086
See application file for complete search history.

(56) References Cited

U.S. PATENT DOCUMENTS

| 5,342,481 A | 8/1994 | Kadomura |
| 2008/0050919 A1 | 2/2008 | Van Aelst et al. |
| 2009/0035944 A1* | 2/2009 | Chiang ............. H01L 21/02063 438/703 |
| 2009/0286400 A1 | 11/2009 | Heo et al. |

(Continued)

FOREIGN PATENT DOCUMENTS

| GB | 2499816 A | 9/2013 |
| GB | 2499816 A | 9/2013 |

(Continued)

OTHER PUBLICATIONS

Versluijs et al., "30nm half-pitch metal patterning using Motif CD shrink technique and double patterning," 2008 SPIE Digital library.

(Continued)

*Primary Examiner* — Zandra Smith
*Assistant Examiner* — Evan Clinton
(74) *Attorney, Agent, or Firm* — Volentine & Whitt, PLLC

(57) ABSTRACT

A method of etching a feature in a substrate includes forming a mask structure over the substrate, the mask structure defining at least one re-entrant opening, etching the substrate through the opening to form the feature using a cyclic etch and deposition process, and removing the mask.

19 Claims, 6 Drawing Sheets

(56) References Cited

U.S. PATENT DOCUMENTS

2012/0322268 A1* 12/2012 Kim .................... H01L 21/3065
438/703

FOREIGN PATENT DOCUMENTS

| WO | WO2005024904 A2 | 3/2005 |
| WO | WO2006065630 A2 | 6/2006 |
| WO | WO2006096528 A2 | 9/2006 |
| WO | WO2006096528 A3 | 9/2006 |
| WO | WO2006130319 A2 | 12/2006 |
| WO | WO2009085598 A2 | 7/2009 |

OTHER PUBLICATIONS

Search Report for GB1322931.5 Dated Jul. 16, 2014.

* cited by examiner

METHOD OF ETCHING

BACKGROUND

This invention relates to a method of etching a feature in a substrate, with particular, but by no means exclusive, reference to the etching of one or more features in a semiconductor substrate such as a silicon substrate.

The etching of features in silicon is a ubiquitous aspect of semiconductor device fabrication. However, etched features in silicon can be difficult to line or fill using subsequent CVD and PVD processes unless the side walls of the etched features have a positive taper and there is a low undercut of the mask. The control of these aspects of the etch is often done at the expense of the etch rate. However, it is evident that a high throughput is necessary if a process is to be production worthy. A particular problem is encountered with the commonly used cyclic etch and deposition technique, in which an etch step is performed which is followed by a deposition step. The process is cyclic, i.e., a number of cycles are employed, in which each cycle includes an etch step and an associated deposition step. The seminal process of this general type is commonly described as the Bosch process. The Bosch process is described in U.S. Pat. No. 5,501,893, the entire contents of which are herein incorporated by reference. The deposition step typically deposits a passivation material such as a polymer onto the sidewalls of the etched feature. Variants on the Bosch process are known, including variants in which each cycle includes a further step additional to the etch and deposition steps. The features etched using the Bosch process and its variants often produce a substantial undercut, which for the reasons described above give rise to processing problems. FIG. 1 is an SEM micrograph showing an example of the relatively large undercutting observed after a conventional Bosch process in which a feature is etched in silicon through a lithographically produced aperture in a mask. These problems exist with the formation of high aspect ratio trenches, the formation of vias, and in other applications. Although these problems are not limited to any particular feature size, they are particularly apparent at the micron and sub-micron level. US2006/0134917 and U.S. Pat. No. 7,250,371 disclose methods for forming etched features of low critical dimension (CD) in which a mask is deposited and a conformal deposition layer is deposited on the side walls of openings in the mask. However, these documents do not address the problems discussed above.

SUMMARY

The present invention, in at least some of its embodiments, addresses the above described problems. Other advantages, which are associated with at least some embodiments of the invention, will also become apparent from the following description.

According to a broad aspect of the invention there is provided a method of etching a feature in a substrate including the steps of:

forming a mask structure over the substrate, the mask structure defining at least one re-entrant opening;

etching the substrate through the opening to form the feature; and removing the mask.

According to a first aspect of the invention there is provided a method of etching a feature in a substrate including the steps of:

forming a mask structure over the substrate, the mask structure defining at least one re-entrant opening;

etching the substrate through the opening to form the feature using a cyclic etch and deposition process; and removing the mask.

In this way, features having a positive profile taper and a reduced undercut can be fabricated. The features can be etched at a high etch rate. A further advantage is that it is possible to use existing, conventional etch processes whilst realising some or all of the advantages associated with the invention.

The substrate may be a semiconductor substrate such as a silicon substrate.

Advantageously, the mask structure includes a first mask and a second mask which is formed over at least a portion of the first mask, in which the second mask defines the re-entrant opening. The first mask may have an aperture formed therein. The second mask may extend into the aperture to define the re-entrant opening. The aperture may be a lithographically formed aperture.

The second mask may be formed from a polymeric material. The polymeric material may be an organic polymeric material. The organic polymeric material may be a fluorocarbon polymer, preferably a per-fluorocarbon polymer. The organic polymeric material may be deposited onto the first mask using a $C_4F_8$ precursor.

The second mask may be built up by cyclically depositing and etching the polymeric material. By varying factors associated with the cyclical deposition and etching process, it is possible to control the topography of the second mask in the vicinity of the opening. The lateral thickness of the polymeric material and/or the shape of the polymeric material can be controlled. For example, the lateral thickness of the polymeric material may be controlled by controlling the number of cycles of deposition and etching of the polymeric material. By controlling the thickness of the deposited polymeric material in relation to the removal rates of material achieved through etching, the shape of the second mask can be controlled.

The first mask may be a hard mask, such as a silicon dioxide mask.

In other embodiments, the mask structure is formed from a single mask. The single mask may be a hard mask.

The opening may have a cross-sectional dimension which is less than 10 microns, preferably less than 5 microns, more preferably less than 2 microns and most preferably less than 1 micron. It is advantageous that the invention is readily applicable to nanotechnology applications.

The mask structure may define a collar region around the opening, wherein the collar region slopes inwardly towards the opening. The portion of the mask structure which defines the opening may be present as a bread-loafing formation. The embodiments in which the mask structure includes a first mask and a second mask, the second mask may be present as a bread-loafing formation which defines the opening.

The mask structure may be in direct contact with the substrate. However, it is also possible for the mask structure to be in indirect contact with the substrate, i.e., one or more other layers may be disposed between the mask structure and the substrate providing that the substrate can be etched through the mask structure and the additional layers.

The feature etched may be a high aspect ratio trench or a via.

The step of etching the substrate may be performed using a cyclic etch and deposition process. The cyclic etch and deposition process may be the Bosch process or a variant thereof. The Bosch process is described in U.S. Pat. No. 5,501,893, the entire contents of which are herein incorporated by reference. Although the invention is particularly well suited to Bosch process etches and variants thereof, it is also suitable to be used in conjunction with other conventional etch processes such as oxide and nitride etches using fluorocarbon polymers.

According to a second aspect of the invention there is provided a substrate having a feature etched therein using a method according to the first aspect of the invention.

Whilst the invention has been described above, it extends to any inventive combination of the features described above, or in the following description, claims and drawings.

BRIEF DESCRIPTION OF THE DRAWINGS

Embodiments of methods in accordance with the invention will now be described with reference to the accompanying drawings, in which.

DETAILED DESCRIPTION

Figure 1:
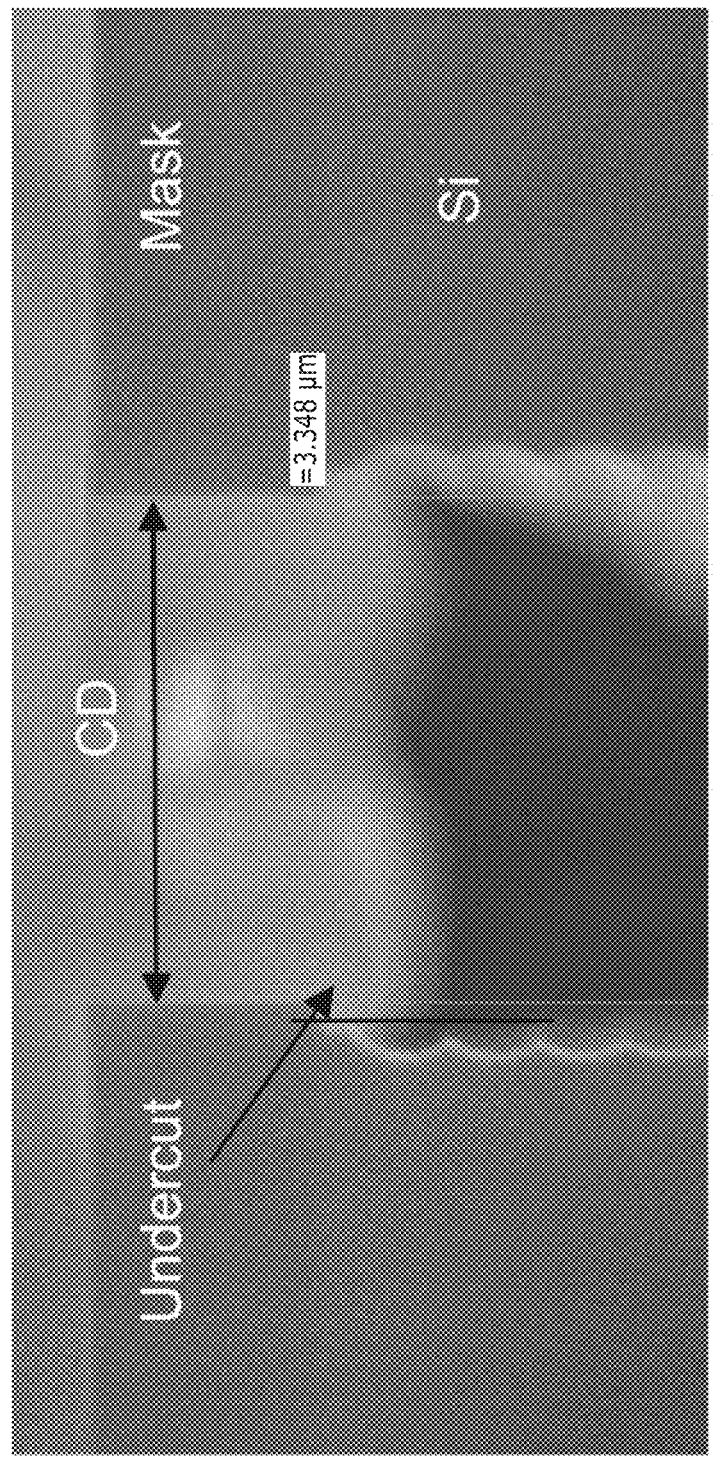
FIG. 1 is an SEM micrograph of an etched feature produced using a conventional fabrication process showing CD loss due to undercut.
Figure 2:
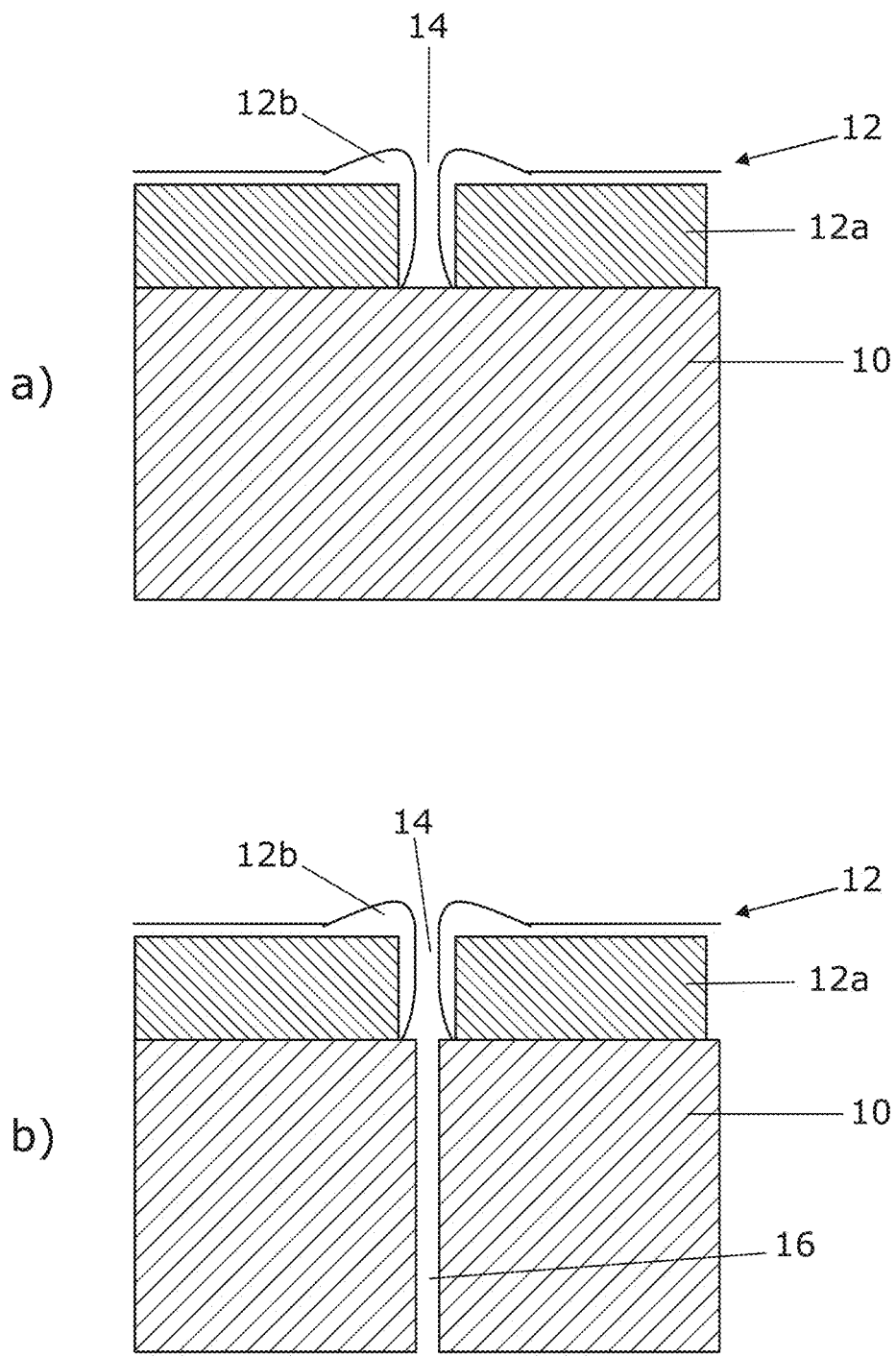
FIG. 2 is a semi-schematic cross-sectional view of (a) a substrate with a mask structure before etching and (b) a feature in the substrate after etching.

FIG. 2(a) shows a substrate 10 to be etched having a mask structure 12 formed thereon. The mask structure 12 comprises a hard mask 12a and a shadow mask 12b. The hard mask 12a has an aperture which is formed in a conventional way. The shadow mask 12b is deposited over the hard mask 12a and also is deposited into the aperture to form an opening 14 through which a subsequent etch process can take place. The deposition of the shadow mask 12b is non-conformal. In particular, the shadow mask is deposited as non-conformal side walls of the aperture of the mask 12a. In the embodiment shown in FIG. 2, the topography of the shadow mask 12b in the vicinity of the aperture is of a bread-loaf formation. However, it is not essential that a bread-loaf formation is provided. What is considered to be important is the re-entrant profile of the side walls of the shadow mask 12b in the aperture of mask 12a. The re-entrant side walls of the shadow mask 12b form an opening 14 through which a subsequent etch process can take place. It will be apparent that the CD of the opening 14 is less than the CD of the aperture which was formed by conventional means. Subsequent to the mask structure 12 being formed, the substrate 10 is etched using a suitable etch process. FIG. 2(b) shows an etched trench 16 resulting from the subsequent etch process. After the trench 16 is formed, the mask structure is removed.

The hard mask 12a can be formed in any convenient manner. However, it is extremely convenient to utilise a photoresist mask. Suitable apertures can be formed using conventional lithographic techniques.

Figure 3:
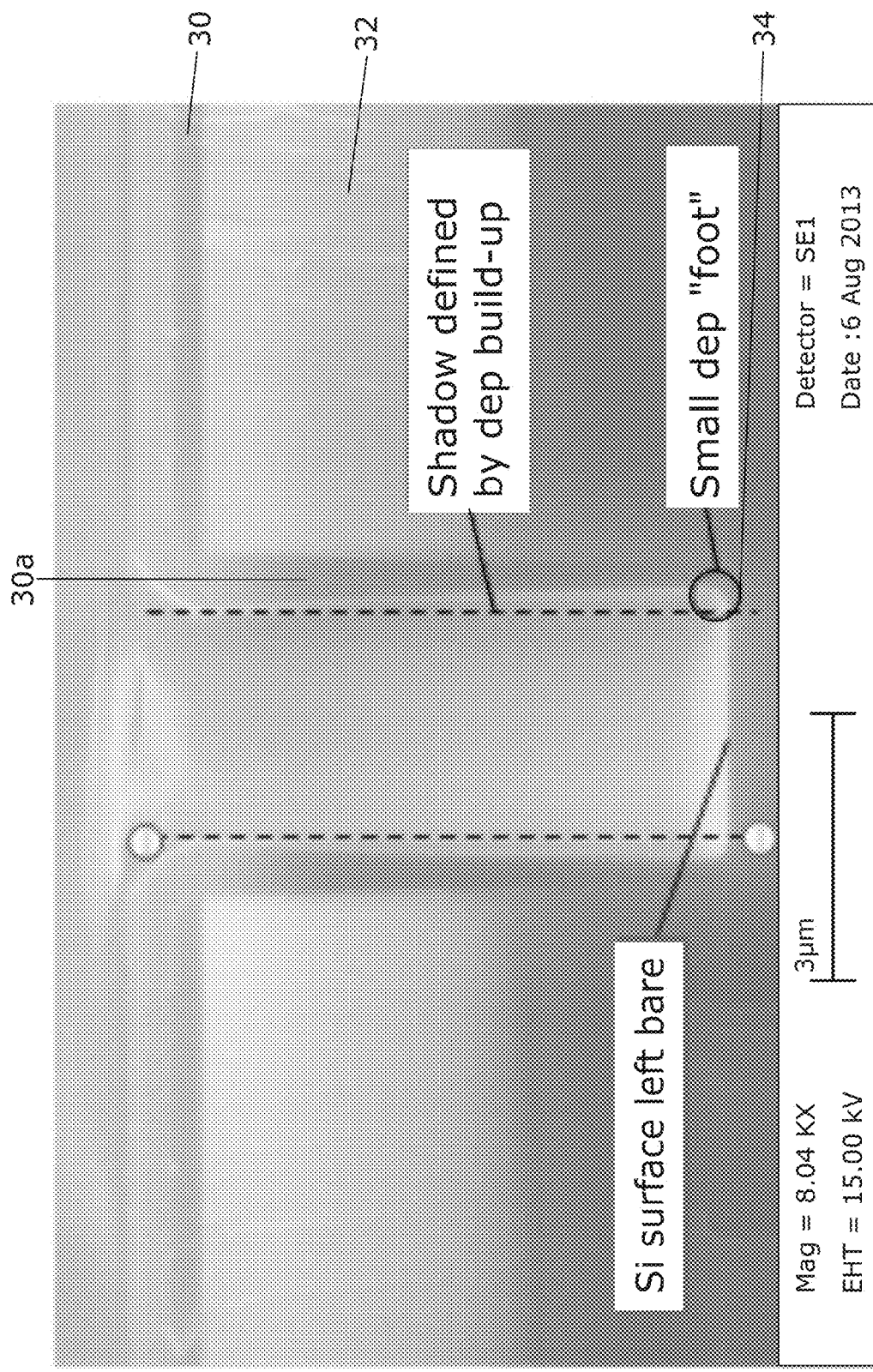
FIG. 3 is an SEM micrograph of a re-entrant polymer layer formed over a silicon dioxide mask.

In practice, the re-entrant shadow mask 12b can be achieved by building up a passivation layer. This can be done by depositing a polymer layer. In one embodiment, a polymer layer is plasma deposited using $C_4F_8$ precursor. A convenient way of controlling the deposition of a polymer layer as a shadow mask is to use a switched process in which a polymer deposition step is followed by an etch process. In one embodiment, a switched process was used in which a $C_4F_8$ deposition step was followed by an $Ar/O_2$ etch/sputter step on an oxide mask, this process being cycled a desired number of times. FIG. 3 shows a re-entrant polymer layer 30 formed over a six micron thick $SiO_2$ mask 32. The polymer layer 30 forms re-entrant side walls 30a in an aperture of the mask 32. The dotted lines shown in FIG. 3 are vertical lines corresponding to the furthest locations of the polymer layer inward of the aperture in the mask 32. It will be apparent that the gap between the dotted lines in FIG. 3 corresponds to the CD of the opening in the overall mask structure. Also, it will be apparent to the skilled reader that the re-entrant profile of the polymer layer 30 in the aperture and the mask 32 has the effect that there are 'shadows' between the dotted lines in FIG. 3 and the corresponding side walls 30a of the polymer layer 30. The lateral thickness of the polymer layer 30 can be controlled by controlling the number of cycles of deposition and etch. By varying the deposition thickness versus the removal rate during etching, the shape of the polymer layer profile can be modified. It was found that a small amount of polymer was deposited in the lower corner as a small 'foot' 34, but this can be easily removed during the etch step.

Tests were run in which features were etched using processes of the invention and also using standard processes. In all instances, a Bosch process cyclical etch/deposition methodology was used to etch the feature, and the etch step was terminated after five cycles. The process conditions, mask configuration and structural parameters are shown below in Table 1 and Table 2. Commercially available etch tools can be used or readily adapted to produce the shadow mask. For example, Si DRIE etch tools sold by the applicant under the trade name Pegasus can be used. As shown in Table 1, a cyclic polymer deposition process is employed for a desired number of cycles. An inductively coupled plasma is produced using an RF source to initiate and sustain a plasma. The substrate is positioned on a platen which has an RF bias applied to it. FIGS. 4(a)-(c) show the results of etching using processes of the present invention, which all involved the use of a shadow mask produced by plasma polymerisation using $C_4F_8$ precursor in combination with a six micron thick $SiO_2$ hard mask. In these processes, a shadow mask was formed using cyclical 60 cycle polymer deposition and etch steps, which were performed cyclically over three, four and five cycles, respectively.

TABLE 1

Cyclic polymer deposition process conditions.

| | 1 | 2 | 3 |
|---|---|---|---|
| Step | Strike | Polymer Dep | Etch/Sputter |
| Step duration (sec) | 1 | 1.3 | 3 |
| RF source (watts) | 2500 | 2500 | 2500 |
| Platen bias (watts) | | | 160 |
| Helium BP (Torr) | | 15 | |
| P C4F8 (sccm) | 220 | 330 | |
| P O2 (sccm) | 100 | | 25 |
| P Ar (sccm) | 300 | | 100 |
| Temp (° C.) | | 5 | |

After each shadow mask was deposited, a 90 s etch was performed to remove the polymer foot described above. By increasing the number of depositions/etch cycles from three to five, the opening near the top of the mask is reduced from 1.77 microns to 1.24 microns, whilst the width of the etched feature is reduced from 1.88 microns to 1.33 microns. The Bosch cyclical etch/deposition process was then performed to etch the feature in the silicon substrate. The undercut is found to be less than 65 nm, which is considerably lower than that achieved with standard masks. With the standard masks shown in FIGS. 4(d) and (e) the undercut was over 100 nm. It can be concluded that with the present invention features sizes having a smaller CD than with conventional hard masks can be realised with a reduced undercut. The tests confirm that the CD of the etched feature is considerably less than the CD of the lithographically produced aperture in the hard mask which the shadow mask was deposited into.

TABLE 2

Figure 4:
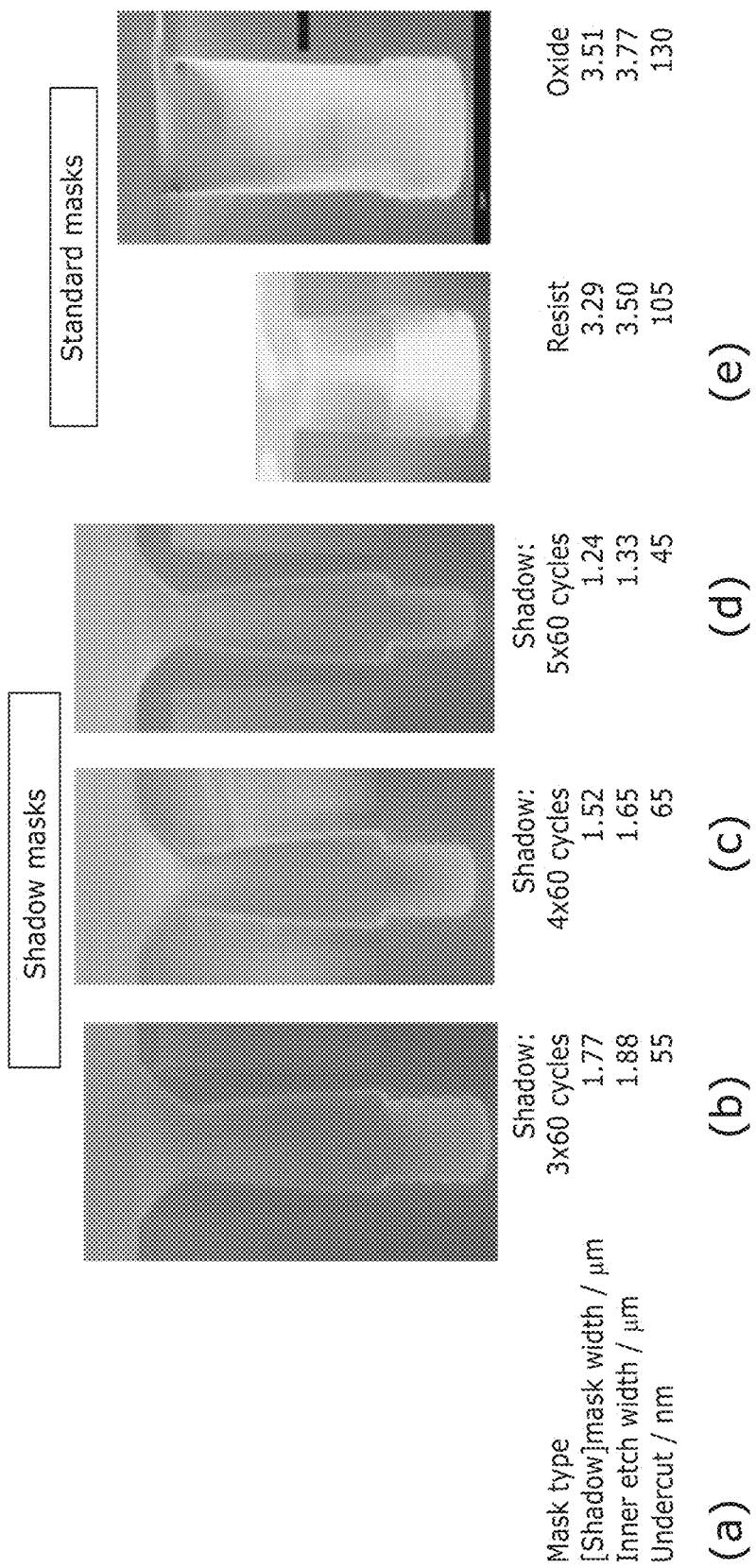
FIG. 4 shows SEM micrographs of (a)-(c) features etched using the invention and (d)-(e) features etched using conventional processes.

Parameters relating to the masks and etched features shown in FIG. 4.

| Mask type | Shadow: 3 × 60 s cycles | Shadow: 4 × 60 s cycles | Shadow: 5 × 60 s cycles | Resist | Oxide |
|---|---|---|---|---|---|
| (Shadow) mask width/μm | 1.77 | 1.52 | 1.24 | 3.29 | 3.51 |
| Inner etch width/μm | 1.88 | 1.65 | 1.33 | 3.50 | 3.77 |
| Undercut/nm | 55 | 65 | 45 | 105 | 130 |
| FIG. 4 | (a) | (b) | (c) | (d) | (e) |

Figure 5:
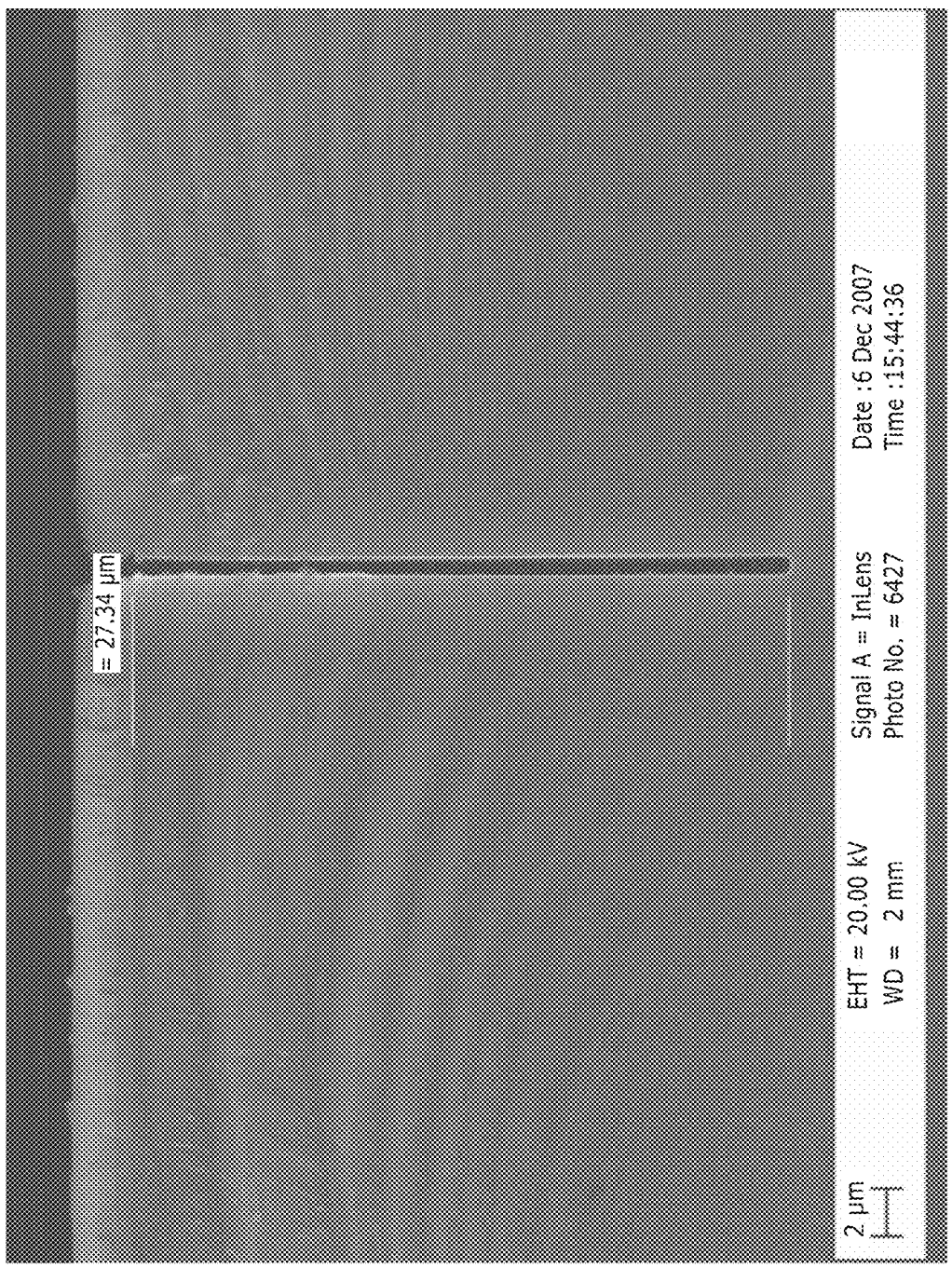
FIG. 5 is an SEM micrograph of a high aspect ratio sub-micron etch feature.
Figure 6:
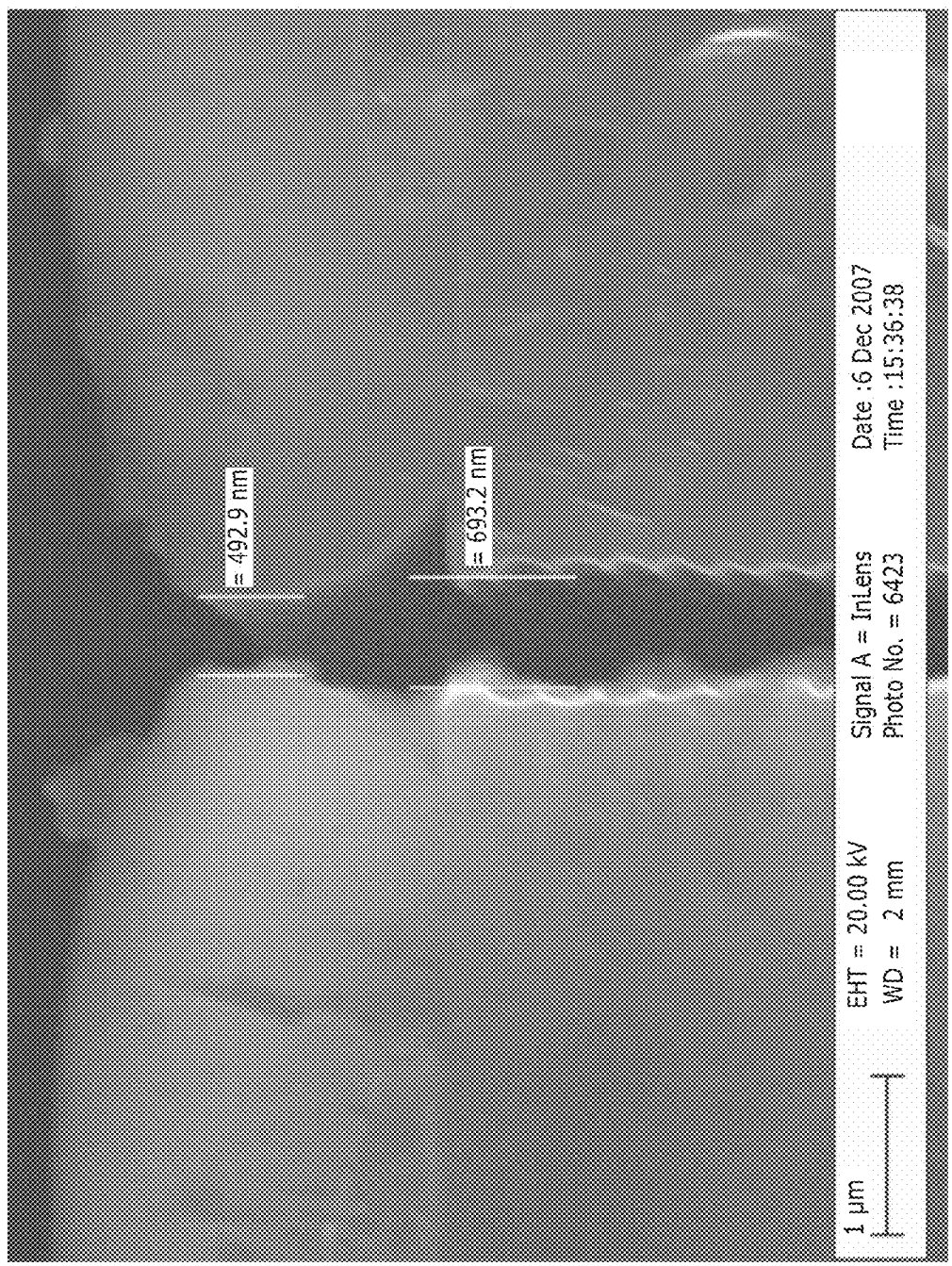
FIG. 6 is a second SEM micrograph of a sub-micron high aspect ratio etch feature.

FIGS. 5 and 6 show SEM micrographs of trenches etched using the present invention. FIGS. 5 and 6 show an etch having a width of less than 0.7 micron in a silicon substrate. The depth of the feature is 27.3 microns with a high aspect ratio of greater than 38:1. The etch rate achieved by this process was greater than 1 micron/min. It is advantageous that excellent control of the CD is achieved. It is of considerable benefit that this CD control can be achieved using conventional process recipes and conventional wafer-scale mask lithography techniques. It is possible to avoid the use of polymer heavy recipes in the main etch, and this is the advantage that the process can be stable in a production environment. It is possible to avoid slow and/or expensive e-beam lithographic techniques. A further benefit is that shadow masks produced as a passivation layer can be easily removed after the etch step has been completed.

It is possible to produce the re-entrant mask profile in other ways, such as by using a hard mask having one or more apertures which have a re-entrant profile. The present invention is well suited for use in conjunction with a Bosch process etch. However, it can also be used in conjunction with other etch processes, for example with oxide and nitride etches using fluorocarbon polymers.

What is claimed is:

1. A method of forming a feature in a substrate including the steps of:

forming a mask structure over the substrate and directly on an upper surface, wherein the forming of the mask structure comprises forming a mask layer directly on the upper surface and forming an aperture through the mask layer such that a portion of the upper surface is circumscribed by an edge of the mask layer delimiting a bottom of the aperture and said portion of the upper surface is exposed via the aperture, and subsequently forming re-entrant structure that constricts access via the aperture to said portion of the upper surface by defining a re-entrant opening that is within the bounds of and is narrower in a horizontal direction than the aperture as viewed in plan;

subsequently etching the substrate through the re-entrant opening using a cyclic etch and deposition process that forms, in the underlying structure, a feature having a maximum critical dimension (CD) in said horizontal direction which is smaller than the CD of the aperture in said horizontal direction; and removing the mask structure.

2. A method according to claim 1 in which the substrate is a semiconductor substrate.

3. A method according to claim 2 in which the substrate is a silicon substrate.

4. A method according to claim 1 in which the the mask layer and the aperture therethrough are formed as a first mask on the upper surface of the underlying structure such that the mask layer is uncovered when the aperture is formed, and the forming of the mask structure comprises subsequently forming a second mask by forming a layer of material over at least a portion of the first mask, the second mask defining the re-entrant opening.

5. A method according to claim 4 in which the forming of the first mask comprises lithographically forming the aperture, and the forming of the second mask comprises forming a layer of material on the first mask and that extends into the aperture to define the re-entrant opening.

6. A method according to claim 4 in which the second mask is formed of polymeric material.

7. A method according to claim 6 in which the polymeric material is an organic polymeric material.

8. A method according to claim 7 in which the organic polymeric material is a fluorocarbon polymer.

9. A method according to claim 8 in which the organic polymeric material is deposited onto the first mask using a $C_4F_8$ precursor.

10. A method according to 5 in which the forming of the second mask comprises cyclically depositing and etching the polymeric material.

11. A method according to claim 4 in which the first mask is a hard mask.

12. A method according to claim 1 in which the mask structure is formed of only a single mask.

13. A method according to claim 1 in which the re-entrant opening has a dimension in said horizontal direction which is less than 10 microns.

14. A method according to claim 1 in which the forming of the mask structure comprises forming a collar of material delimiting the re-entrant opening, wherein the collar has a surface above the mask layer that slopes inwardly towards the re-entrant opening.

15. A method according to claim 1 in which the mask structure is formed directly on the substrate such that said upper surface is a major surface of the substrate.

16. A method according to claim 1 in which the feature is a trench or a via and the maximum CD of the feature is the maximum width of the trench or maximum diameter of the via in said horizontal direction.

17. A substrate having a feature etched therein using a method according to claim 1.

18. A method according to claim 13 in which the re-entrant opening has a cross-sectional dimension which is less than 1 micron.

19. A method according to claim 1 in which the feature has an aspect ratio of greater than 38:1.

\* \* \* \* \*